(12) United States Patent
Sekiya

(10) Patent No.: US 10,177,034 B2
(45) Date of Patent: Jan. 8, 2019

(54) WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 124 days.

(21) Appl. No.: 15/286,246

(22) Filed: Oct. 5, 2016

(65) Prior Publication Data

US 2017/0103920 A1  Apr. 13, 2017

(30) Foreign Application Priority Data

Oct. 13, 2015  (JP) .................................. 2015-201933

(51) Int. Cl.
*H01L 21/78*  (2006.01)
*H01L 21/304* (2006.01)
*H01L 21/3065* (2006.01)

(52) U.S. Cl.
CPC ............ *H01L 21/78* (2013.01); *H01L 21/304* (2013.01); *H01L 21/3065* (2013.01)

(58) Field of Classification Search
CPC ...................................... H01L 21/78
See application file for complete search history.

(56) References Cited

U.S. PATENT DOCUMENTS

2014/0120344 A1* 5/2014 Yamamoto ............. C09J 7/0271
428/343
2016/0035577 A1* 2/2016 Lei .......................... H01L 21/78
438/462

FOREIGN PATENT DOCUMENTS

JP  2006-114825  4/2006

* cited by examiner

*Primary Examiner* — Yu-Hsi D Sun
(74) *Attorney, Agent, or Firm* — Greer Burns & Crain, Ltd.

(57) ABSTRACT

A wafer processing method including a protective plate attaching step of attaching a protective plate to the front side of a wafer, a support member providing step of providing a support member on the back side of the wafer, a protective plate cutting step of cutting the protective plate along an area corresponding to each division line formed on the front side of the wafer, thereby exposing each division line, and a plasma etching step of performing plasma etching through the protective plate to each division line of the wafer, thereby etching each division line to divide the wafer into individual device chips.

13 Claims, 5 Drawing Sheets

WAFER PROCESSING METHOD

BACKGROUND OF THE INVENTION

Field of the Invention

The present invention relates to a wafer processing method for processing a wafer having a plurality of devices formed on the front side so as to be separated by a plurality of division lines.

Description of the Related Art

A plurality of devices such as integrated circuits (ICs) and large-scale integrations (LSIs) are formed on the front side of a wafer so as to be separated by a plurality of division lines. The wafer thus having the plural devices on the front side is divided into individual device chips by using a dicing apparatus, for example. The device chips are used in various electric equipment such as mobile phones and personal computers.

In the case that the wafer is divided into the individual device chips by using a cutting blade included in the dicing apparatus, there is a problem such that minute chipping occurs on the periphery of each device chip to cause a reduction in die strength. To cope with this problem, the present applicant has proposed a processing method which can improve the die strength of each device chip, and this processing method has been put to practical use. This processing method includes the steps of entirely covering the front side of a wafer with a resist film, next removing the resist film from the division lines by exposure, and next removing the division lines by plasma etching to thereby divide the wafer into the individual device chips (see Japanese Patent Laid-open No. 2006-114825, for example).

SUMMARY OF THE INVENTION

However, in the above processing method, a high-precision mask and exposure apparatus are required in performing the exposure to the resist film entirely covering the front side of the wafer to remove the resist film from the division lines. Accordingly, there is a problem such that the cost is increased and the productivity of the device chips is reduced.

Further, the resist film formed on the division lines of the front side of the wafer is removed by a toxic developer such as tetra methyl ammonium hydroxide (TMAH) in the exposure process, and the resist film after ending the plasma etching is removed from the whole of the front side of the wafer by using an organic solvent such as N-methyl pyrrolidone (NMP). Accordingly, there is a possibility of environmental pollution. To cope with this problem, any dedicated disposal equipment is needed, so that there is an additional problem such that the costs for installation and maintenance of equipment are increased and the production efficiency is also reduced.

It is therefore an object of the present invention to provide a wafer processing method which can reduce the cost and improve the productivity of the device chips in dividing the wafer into the individual device chips by plasma etching.

In accordance with an aspect of the present invention, there is provided a wafer processing method for dividing a wafer into individual device chips, the wafer having a plurality of devices formed on the front side so as to be separated by a plurality of division lines, the wafer processing method including a protective plate attaching step of attaching a protective plate to the front side of the wafer; a support member providing step of providing a support member on the back side of the wafer; a protective plate cutting step of cutting the protective plate along an area corresponding to each division line formed on the front side of the wafer, thereby exposing each division line; and a plasma etching step of performing plasma etching through the protective plate to each division line of the wafer after performing the protective plate cutting step, thereby etching each division line to divide the wafer into the individual device chips.

Preferably, the wafer processing method further includes a back grinding step of grinding the back side of the wafer to thereby reduce the thickness of the wafer after performing the protective plate attaching step and before performing the support member providing step. Preferably, the protective plate is formed of any one of silicon, glass, and polyethylene terephthalate. In the case that the protective plate is formed of silicon, an $SiO_2$ film is formed on the surface of the protective plate. Preferably, the protective plate is attached through a wafer-soluble resin to the front side of the wafer in the protective plate attaching step.

According to the present invention, it is unnecessary to use any high-precision mask and exposure apparatus in dividing the wafer, thereby reducing the cost and improving the productivity of the device chips. Further, in the case that the wafer processing method further includes the back grinding step of grinding the back side of the wafer to thereby reduce the thickness of the wafer after performing the protective plate attaching step and before performing the support member providing step, higher-quality device chips can be produced.

In the case that the protective plate is formed of silicon, an $SiO_2$ film is formed on the surface of the protective plate. Accordingly, the progress of plasma etching to the protective plate in the plasma etching step can be retarded, so that the wafer can be reliably divided into the individual device chips. Further, in the case that the protective plate is attached through a water-soluble resin to the front side of the wafer in the protective plate attaching step, the protective plate can be removed from the front side of the wafer by using a pure water, for example, after performing the plasma etching step. Accordingly, no dedicated disposal equipment is needed. As a result, the cost can be reduced and the production efficiency of the device chips can be improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
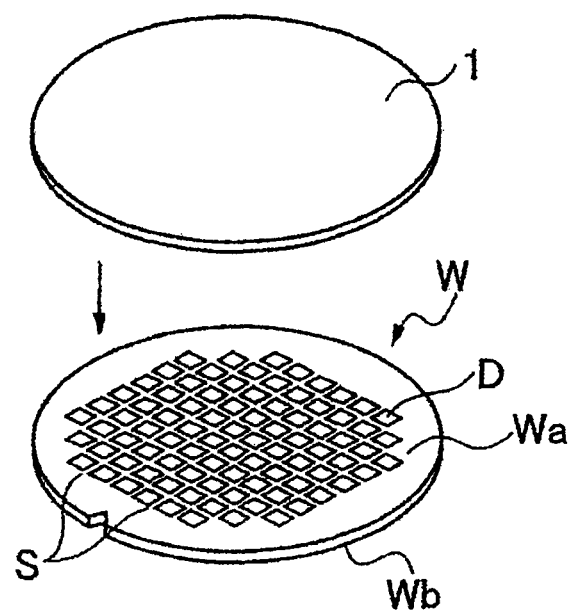
FIG. 1A is a perspective view showing a protective plate attaching step.

Referring to FIG. 1A, a wafer W is shown as an example of a disk-shaped workpiece. The wafer W has a front side Wa and a back side Wb opposite to the front side Wa. The front side Wa of the wafer W is partitioned by a plurality of crossing division lines S to form a plurality of separate devices D. The back side Wb of the wafer W is not especially formed with anything, but it is a work surface to be ground by abrasive members in thinning the wafer W, for example. There will now be described a wafer processing method for dividing the wafer W into individual device chips by plasma etching, with reference to the attached drawings.

(1) Protective Plate Attaching Step

As shown in FIG. 1A, a protective plate 1 is attached to the front side Wa of the wafer W. The protective plate 1 is a circular member having a diameter equal to or greater than the diameter of the wafer W, so that the front side Wa of the wafer W can be entirely covered with the protective plate 1. The protective plate 1 is formed of any one of silicon, glass, and polyethylene terephthalate (PET). In the case that the protective plate 1 is formed of silicon, an $SiO_2$ film is preferably formed on the surface of the protective plate 1. By forming the $SiO_2$ film on the surface of the protective plate 1, the progress of the plasma etching to the protective plate 1 in a plasma etching step to be hereinafter described can be retarded, so that the wafer W can be reliably divided into individual device chips.

Figure 1B:
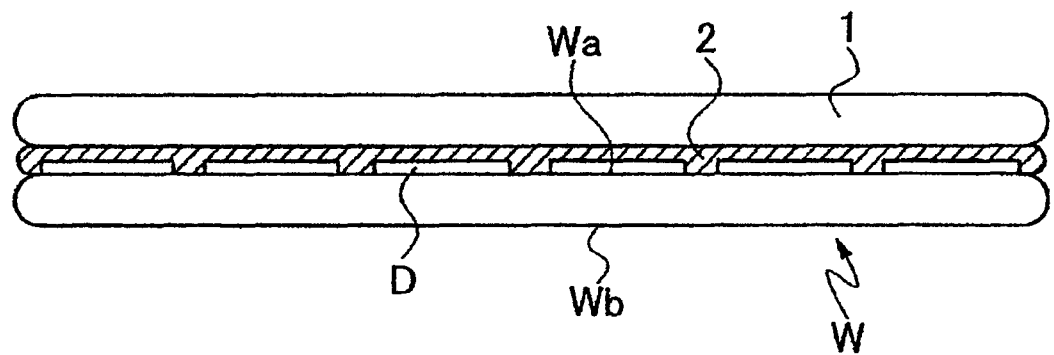
FIG. 1B is a sectional view showing a condition that a protective plate is attached to the front side of a wafer.

As shown in FIG. 1B, the protective plate 1 is preferably attached through a water-soluble resin 2 to the front side Wa of the wafer W. An acrylic resin may be used in place of the water-soluble resin 2. Accordingly, the front side Wa of the wafer W is entirely covered with the protective plate 1. As the water-soluble resin 2, a liquid resin such as polyvinyl alcohol (PVA) may be used.

(2) Back Grinding Step

Figure 2:
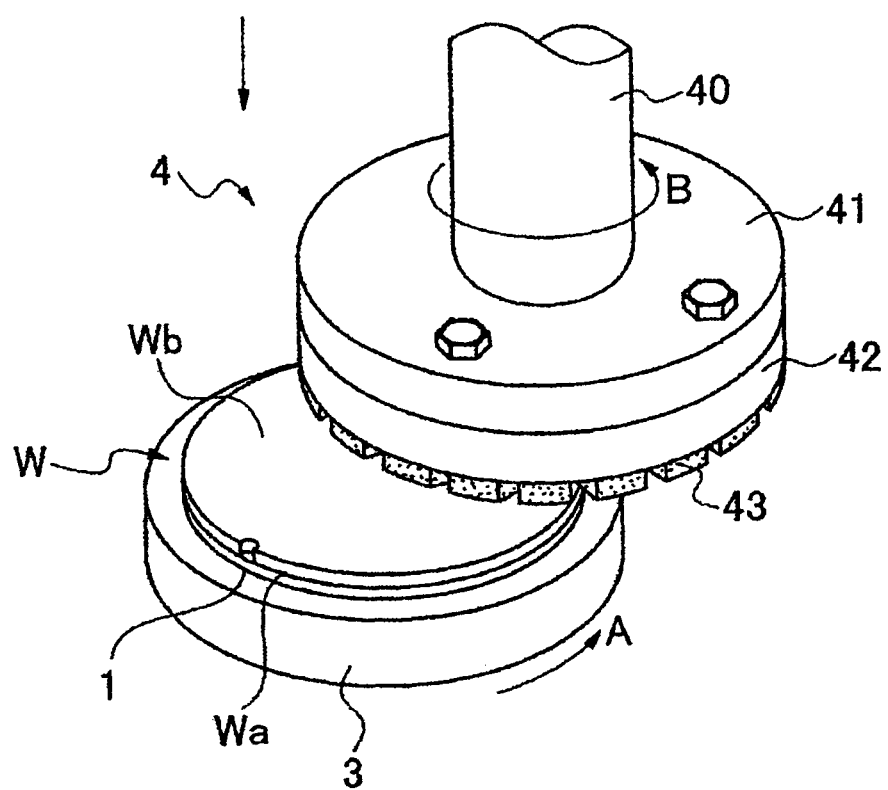
FIG. 2 is a perspective view showing a back grinding step.

After performing the protective plate attaching step and before providing a support member to be hereinafter described, the back side Wb of the wafer W is ground until a predetermined thickness of the wafer W is reached, by using grinding means 4 shown in FIG. 2. The grinding means 4 includes a spindle 40 having a vertical axis of rotation, a grinding wheel 42 mounted through a mount 41 to the lower end of the spindle 40, and a plurality of abrasive members 43 fixed to the lower surface of the grinding wheel 42 so as to be annularly arranged along the outer circumference thereof. The grinding wheel 42 is rotatable and the grinding means 4 is vertically movable as a whole.

In grinding the back side Wb of the wafer W, the wafer W with the protective plate 1 is placed on a rotatable holding table 3 for holding a workpiece in the condition where the protective plate 1 attached to the front side Wa of the wafer W is in contact with the upper surface of the holding table 3. Thereafter, a suction source (not shown) is operated to hold the wafer W on the holding table 3 under suction in the condition where the back side Wb of the wafer W is oriented upward, or exposed. Thereafter, the holding table 3 is rotated in the direction shown by an arrow A in FIG. 2 at a predetermined speed (e.g., 300 rpm). Further, the spindle 40 of the grinding means 4 is rotated by a drive source (not shown) to thereby rotate the grinding wheel 42 in the direction shown by an arrow B in FIG. 2 at a predetermined speed (e.g., 6000 rpm). At the same time, the grinding wheel 42 is lowered until the abrasive members 43 come into contact with the back side Wb of the wafer W at a predetermined feed speed (e.g., 1 μm/second). Thereafter, the abrasive members 43 being rotated are pressed on the back side Wb of the wafer W to thereby grind the back side Wb until a predetermined thickness of the wafer W is reached.

(3) Protective Plate Cutting Step

Figure 3:
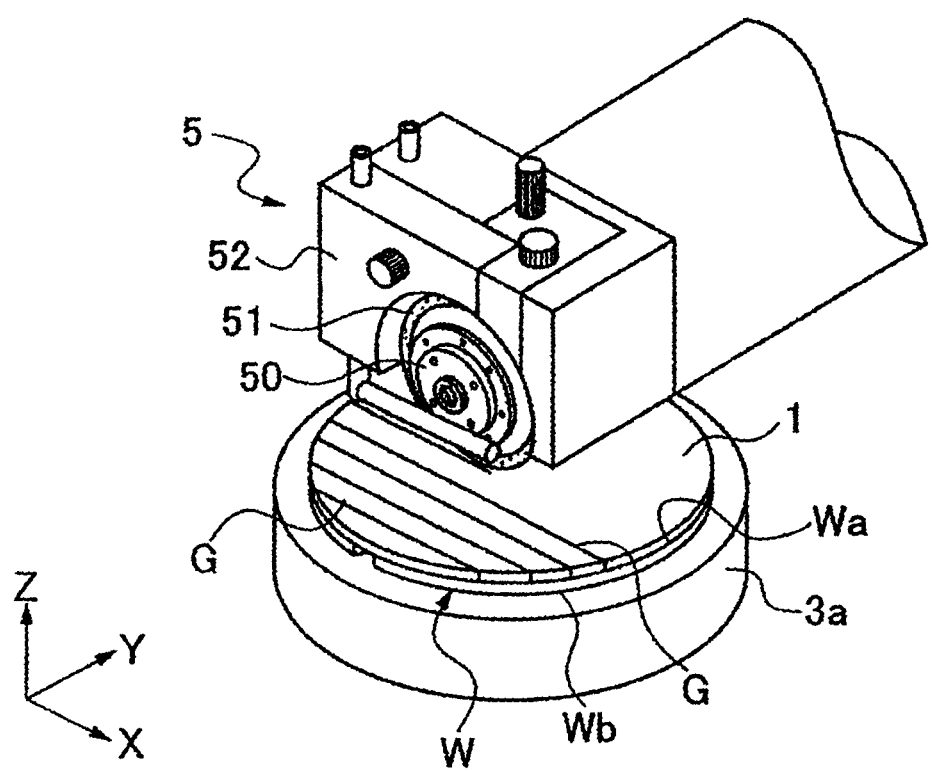
FIG. 3 is a perspective view showing a protective plate cutting step.

After performing the back grinding step, the protective plate 1 is cut along an area corresponding to each division line S shown in FIG. 1 to thereby form a groove along each division line S, by using cutting means 5 shown in FIG. 3. The cutting means 5 includes a spindle 50 having a horizontal axis of rotation, a cutting blade 51 mounted on the spindle 50 at its front end portion, and a blade cover 52 for covering the cutting blade 51. Accordingly, the cutting blade 51 is rotated by rotating the spindle 50.

The wafer W with the protective plate 1 is held on a holding table 3a under suction in the condition where the protective plate 1 is oriented upward, or exposed as shown in FIG. 3. In this condition, alignment known in the art is performed to detect the division lines S. Thereafter, the holding table 3a is moved in the direction (X direction) shown by an arrow X in FIG. 3. At the same time, the spindle 50 of the cutting means 5 is rotated by a drive source (not shown) to thereby rotate the cutting blade 51, and the cutting blade 51 is lowered toward the protective plate 1 in the direction (Z direction) shown by an arrow Z in FIG. 3. Accordingly, the cutting blade 51 being rotated is lowered to cut the protective plate 1 along an area corresponding to a predetermined one of the division lines S extending in a first direction, which coincides with the X direction. In this manner, the protective plate 1 is cut along the area corresponding to the predetermined division line S extending in the first direction by using the cutting blade 51, thereby forming a groove G along the predetermined division line S extending in the first direction, wherein the bottom of the groove G is exposed to the predetermined division line S. In other words, the depth of the groove G is the same as the thickness of the protective plate 1.

After forming the groove G along the predetermined division line S extending in the first direction, the cutting means 5 is indexed in the direction (Y direction) shown by an arrow Y in FIG. 3 by the pitch of the division lines S to repeat the cutting operation along all of the other division lines S extending in the first direction, thus cutting the protective plate 1 along the areas corresponding to all the division lines S extending in the first direction to thereby form similar grooves G in the protective plate 1. The depth of cut by the cutting blade 51 may be set so that at least the protective plate 1 can be fully cut. Further, in the case that a test element group (TEG) is formed on each division line S, the TEG may also be cut off by the cutting blade 51.

After cutting the protective plate 1 along all the division lines S extending in the first direction, the holding table 3a is rotated 90 degrees, so that the other division lines S extending in a second direction perpendicular to the first direction becomes parallel to the X direction. Thereafter, the cutting operation mentioned above is similarly performed to cut the protective plate 1 along the areas corresponding to all the other division lines S extending in the second direction, thereby forming similar grooves G. As a result, all the division lines S formed on the front side Wa of the wafer W are exposed to the respective grooves G formed in the protective plate 1. Thus, the division lines S to be removed by plasma etching can be exposed by using the protective plate 1 cut along the area corresponding to each division line S, without performing high-precision exposure and development. As a modification, the back grinding step may be omitted and this protective plate cutting step may be performed immediately after performing the protective plate attaching step.

(4) Support Member Providing Step

Figure 4:
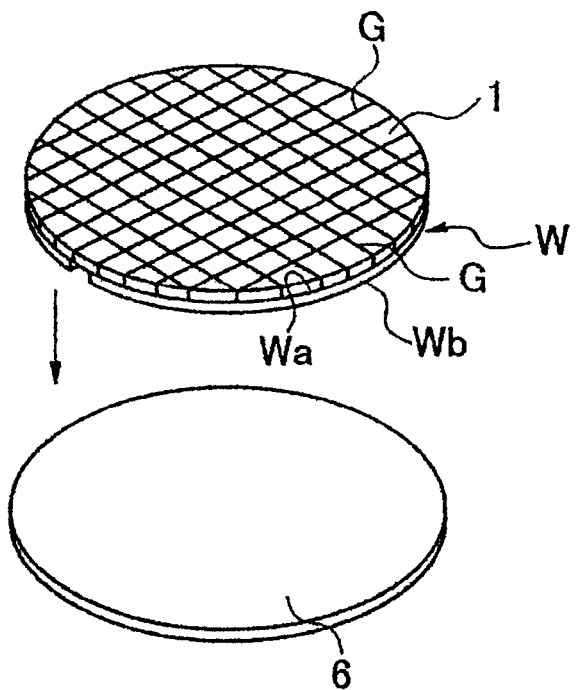
FIG. 4 is a perspective view showing a support member providing step.

After performing the protective plate cutting step, a support member 6 is provided so as to support the back side Wb of the wafer W as shown in FIG. 4. More specifically, polyvinyl alcohol (PVA), for example, is interposed between the back side Wb of the wafer W and the support member 6, and the support member 6 is attached to the back side Wb of the wafer W, thereby supporting the back side Wb (lower surface) of the wafer W to the support member 6.

(5) Plasma Etching Step

Figure 5:
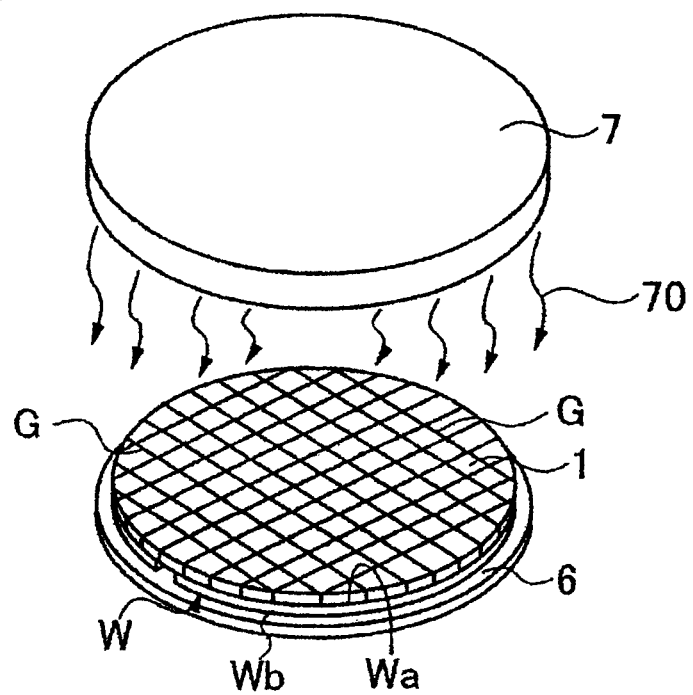
FIG. 5 is a perspective view showing a plasma etching step.

After performing the support member providing step, the division lines S of the wafer W are etched (removed) by plasma etching through the protective plate 1 having the grooves G to thereby divide the wafer W into individual device chips, by using an etching gas supply unit 7 shown in FIG. 5. The etching gas supply unit 7 is provided in a chamber (not shown) and connected to a gas source (not shown) for supplying a fluorine-based gas such as $SF_6$ to a target to be etched. Reference numeral 70 in FIG. 5 denotes an etching gas to be discharged from the etching gas supply unit 7. The etching gas 70 discharged from the etching gas supply unit 7 is dissociated to form a plasma by applying a radio frequency (RF) power from an RF power source (not shown), so that the target is plasma-etched by this plasma.

More specifically, the wafer W is first loaded into the chamber. Thereafter, the etching gas supply unit 7 is operated to discharge the etching gas 70 such as $SF_6$ toward the protective plate 1 at a predetermined processing pressure (e.g. 20 Pa). On the other hand, an RF power of 3000 W (13.5 MHz) is applied from the RF power source (not shown) to the etching gas 70, thereby dissociating the etching gas 70 to form a plasma. Thus, an etching effect is exhibited to etch the division lines S. That is, the protective plate 1 attached to the front side Wa of the wafer W is formed with the grooves G corresponding to the division lines S formed on the front side Wa of the wafer W, wherein the division lines S are exposed to the grooves G of the protective plate 1. Accordingly, the division lines S of the wafer W are etched off through the grooves G of the protective plate 1 by the plasma of the etching gas 70. As a result, the wafer W is divided into individual device chips having the devices D shown in FIG. 1.

(6) Protective Plate Removing Step

Figure 6A:
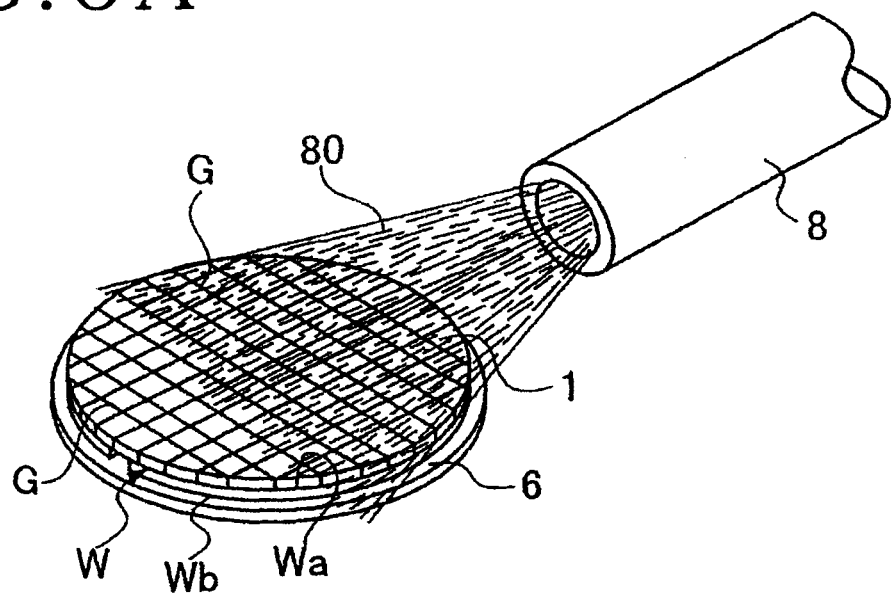
FIG. 6A is a perspective view showing a protective plate removing step.

After performing the plasma etching step, the protective plate 1 is removed from the front side Wa of the wafer W as shown in FIG. 6A. For example, a nozzle 8 for spraying a pure water 80 is located above the wafer W as shown in FIG. 6A. That is, the pure water 80 is sprayed from the nozzle 8 toward the wafer W, thereby removing the protective plate 1 from the front side Wa of the wafer W. As described above, the protective plate 1 is attached through the water-soluble resin 2 to the front side Wa of the wafer W. Accordingly, the water-soluble resin 2 can be dissolved in the pure water 80 sprayed from the nozzle 8, so that the protective plate 1 can be removed from the front side Wa of the wafer W.

Figure 6B:
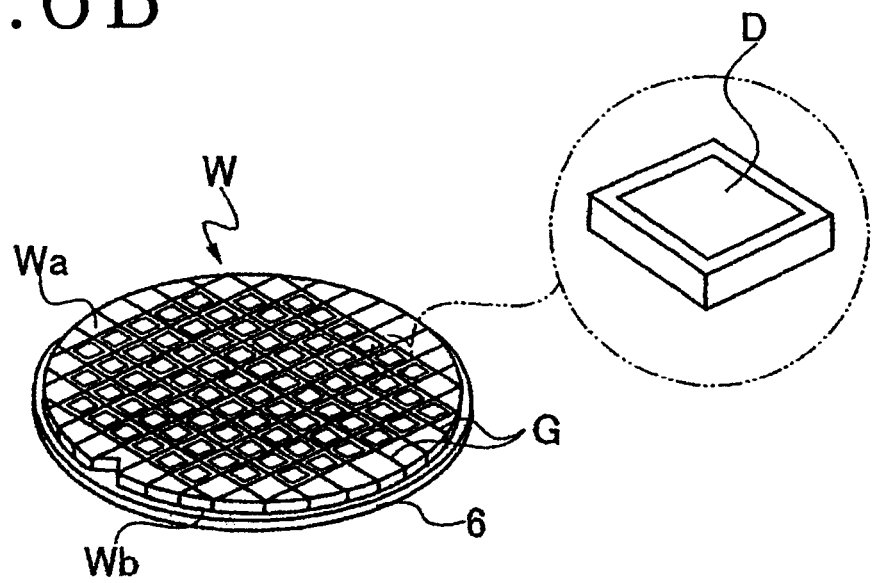
FIG. 6B is a perspective view showing a condition that the protective plate has been removed and individual device chips are supported on a support member.

When the protective plate 1 is removed from the front side Wa of the wafer W, the device chips having the individual devices D are kept supported on the support member 6 as shown in FIG. 6B. These individual device chips are next picked up from the support member 6 and transferred to the next step (e.g., packaging step).

As described above, the wafer processing method of the present invention essentially includes the protective plate attaching step of attaching the protective plate 1 to the front side Wa of the wafer W, the protective plate cutting step of cutting the protective plate 1 along the area corresponding to each division line S after performing the protective plate attaching step, thereby forming the groove G along each division line S so that each division line S is exposed to the corresponding groove G, and the plasma etching step of performing plasma etching to each division line S through the corresponding groove G of the protective plate 1 after performing the protective plate cutting step, thereby dividing the wafer W into the individual device chips having the devices D. Accordingly, it is unnecessary to use any high-precision mask, exposure apparatus, and developer in dividing the wafer W, thereby reducing the cost and improving the productivity of the device chips. Further, in the case that the wafer processing method of the present invention further includes the back grinding step of grinding the back side Wb of the wafer W to thereby reduce the thickness of the wafer W after performing the protective plate attaching step and before performing the support member providing step, higher-quality device chips can be produced.

In this preferred embodiment, the protective plate 1 is attached through the water-soluble resin 2 to the front side Wa of the wafer W in the protective plate attaching step. Accordingly, in performing the protective plate removing step, the protective plate 1 can be easily removed by using the pure water 80. That is, no organic solvent is needed in removing the protective plate 1, so that environmental pollution can be prevented and no dedicated disposal equipment is needed. Accordingly, the costs for installation and maintenance of equipment can be reduced and the disposal time can also be reduced. As a result, the device chips can be produced efficiently.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into individual device chips, said wafer having a plurality of devices formed on a front side so as to be separated by a plurality of division lines, said wafer processing method comprising:
   a protective plate attaching step of attaching a protective plate to the front side of said wafer;
   a support member providing step of providing a support member on a back side of said wafer;
   a protective plate cutting step of cutting said protective plate along an area corresponding to each division line formed on the front side of said wafer, the cutting performed by cutting means having a cutting blade mounted on a spindle, thereby exposing each division line; and
   a plasma etching step of performing plasma etching through said protective plate to each division line of said wafer after performing said protective plate cutting step, thereby etching each division line to divide said wafer into said individual device chips.

2. The wafer processing method according to claim 1, further comprising a back grinding step of grinding the back side of said wafer to thereby reduce the thickness of said wafer after performing said protective plate attaching step and before performing said support member providing step.

3. The wafer processing method according to claim 1, wherein said protective plate is formed of silicon.

4. The wafer processing method according to claim 3, wherein said protective plate is formed of silicon, and an $SiO_2$ film is formed on the surface of said protective plate.

5. The wafer processing method according to claim 1, wherein said protective plate is attached through a wafer-soluble resin to the front side of said wafer in said protective plate attaching step.

6. A wafer processing method for dividing a wafer into individual device chips, said wafer having a plurality of devices formed on a front side so as to be separated by a plurality of division lines, said wafer processing method comprising:
   a protective plate attaching step of attaching a protective plate to the front side of said wafer;
   a support member providing step of providing a support member on a back side of said wafer;
   a protective plate cutting step of cutting said protective plate along an area corresponding to each division line formed on the front side of said wafer, thereby exposing each division line;
   a plasma etching step of performing plasma etching through said protective plate to each division line of said wafer after performing said protective plate cutting step, thereby etching each division line to divide said wafer into said individual device chips; and
   wherein said protective plate is formed of silicon, and an $SiO_2$ film is formed on the surface of said protective plate.

7. The wafer processing method according to claim 1, wherein said protective plate is formed of glass.

8. The wafer processing method according to claim 1, wherein the protective plate is formed of polyethylene terephthalate.

9. The wafer processing method according to claim 1, wherein the protective plate comprises a circular member having a diameter equal to or greater than that of said wafer.

10. The wafer processing method according to claim 1, wherein the protective plate comprises a circular member having a diameter greater than that of said wafer.

11. The wafer processing method according to claim 1, wherein said protective plate comprises a circular member, and further wherein said protective plate attaching step comprises attaching said circular member to said wafer via a resin.

12. The wafer processing method according to claim 1, wherein said protective plate is attached through an acrylic resin to the front side of said wafer in said protective plate attaching step.

13. The wafer processing method according to claim 5, further comprising a protective plate removing step of spraying a pure water from a nozzle toward the wafer to thereby dissolve the water-soluble resin in the sprayed pure water.

* * * * *